US008085358B2

(12) United States Patent
Lu et al.

(10) Patent No.: US 8,085,358 B2
(45) Date of Patent: Dec. 27, 2011

(54) BACKLIGHT MODULE, APPLICATION AND FABRICATION METHOD THEREOF

(75) Inventors: Chiyeh Lu, Tainan County (TW); Shihpin Huang, Tainan County (TW); Chengfeng Yang, Tainan County (TW)

(73) Assignee: Chimei Innolux Corporation, Miao-Li County (TW)

( * ) Notice: Subject to any disclaimer, the term of this patent is extended or adjusted under 35 U.S.C. 154(b) by 458 days.

(21) Appl. No.: 12/414,821

(22) Filed: Mar. 31, 2009

(65) Prior Publication Data
US 2009/0251634 A1   Oct. 8, 2009

(30) Foreign Application Priority Data
Apr. 3, 2008  (TW) ............................... 97112195 A

(51) Int. Cl.
*G02F 1/1335* (2006.01)
*F21V 7/04* (2006.01)
(52) U.S. Cl. ......................................... 349/58; 362/612
(58) Field of Classification Search .............. 349/58–60, 349/61, 65, 149, 150, 152, 12, 122, 158; 362/612, 634; 361/681, 750, 749
See application file for complete search history.

(56) References Cited

U.S. PATENT DOCUMENTS

| 7,292,290 | B2 * | 11/2007 | Miyagawa et al. | 349/58 |
| 7,982,818 | B2 * | 7/2011 | Chung et al. | 349/61 |
| 2002/0130985 | A1 * | 9/2002 | Weindorf et al. | 349/61 |
| 2009/0243960 | A1 * | 10/2009 | Mo | 345/1.3 |
| 2011/0007521 | A1 * | 1/2011 | Wu et al. | 362/612 |

* cited by examiner

*Primary Examiner* — Akm Ullah
(74) *Attorney, Agent, or Firm* — Lowe Hauptman Ham & Berner LLP

(57) ABSTRACT

A backlight module, an application and a fabrication method thereof are described. The backlight module comprises: a light guide plate; a housing clipped to the light guide plate, wherein the housing and the light guide plate form a disposed space; and at least one light-emitting diode (LED) light bar disposed in the disposed space and providing the light guide plate with at least one light, wherein the light-emitting diode light bar comprises a flexible circuit board and a plurality of light-emitting diodes, and the flexible circuit board comprises a first portion and at least two second portions, wherein the light-emitting diodes are disposed on the first portion of the flexible circuit board, and the second portions are stacked with respect to each other.

20 Claims, 5 Drawing Sheets

BACKLIGHT MODULE, APPLICATION AND FABRICATION METHOD THEREOF

CROSS-REFERENCE TO RELATED APPLICATIONS

The present application is based on, and claims priority from, Taiwanese Application Serial Number 97112195, filed Apr. 3, 2008, the disclosure of which is hereby incorporated by reference herein in its entirety.

TECHNICAL FIELD

One or more embodiments of the present invention relate to a backlight module, and more particularly to a backlight module including a light-emitting diode (LED) light bar and an application thereof on a liquid crystal display (LCD).

BACKGROUND

A backlight module of a large extra-thin or a high brightness extra-thin liquid crystal display needs a large amount of light-emitting diodes resulting in a larger wiring area being required for arranging the wires of the light-emitting diodes. Currently, the wiring area of the flexible circuit board of the light-emitting diode light bar is increased typically by increasing the width of the flexible circuit board or by using a multi-layered flexible circuit board.

FIG. 1 illustrates a cross-sectional view of a portion of a conventional backlight module. A backlight module 100a comprises a reflective cover 102, a light guide plate 110 and a light-emitting diode light bar 104, wherein the light-emitting diode light bar 104 is composed of a flexible circuit board 108 and many light-emitting diodes 106 disposed thereon. In the backlight module 100a, in order to provide the light-emitting diodes 106 with a sufficient wiring area, the width w of the flexible circuit board 108 of the light-emitting diode light bar 104 is increased. In the backlight module 100a, the light-emitting diode light bar 104 is disposed in the reflective cover 102, the flexible circuit board 108 extends towards the outside of the reflective cover 102, and the light guide plate 110 is disposed between the upper side plate and the lower side plate of the reflective cover 102, wherein the light guide plate 110 and the reflective cover 102 surround all of the light-emitting diodes 106.

In the backlight module 100a, the width w of the flexible circuit board 108 is sufficiently large to enable stacking the light guide plate 110 on a portion of the flexible circuit board 108. The flexible circuit board 108 has a thickness d, so that the thickness of the backlight module 100a is increased, therefore it cannot fulfill the requirement for the liquid crystal display product, which has a strict requirement of thickness. FIG. 2 depicts a backlight module 100b, in order to solve the issue that the width w of the flexible circuit board 108 of the light-emitting diode light bar is too wide, the flexible circuit board 108 is bent to an L-shape, and the flexible circuit board 108 is adhered to the two adjacent side plates of the reflective cover 102. However, in a larger size or higher brightness liquid crystal display, the flexible circuit board 108 located on the lower side plate of the reflective cover 102 is still too wide, so that the thickness problem remains.

FIG. 3. depicts a backlight module 100c in which, in order to further improve the issue that the width w of the flexible circuit board 108 of the light-emitting diode light bar is too wide, the flexible circuit board 108 is bent to a ninety degree rotated-U shape, and the flexible circuit board 108 is adhered to three side plates of the reflective cover 102. However, the U-shaped flexible circuit board 108 greatly increases the fabrication difficulty.

FIG. 4 illustrates a cross-sectional view of a portion of another conventional backlight module 100d. A light-emitting diode light bar 114 of backlight module 100d adopts a flexible circuit board 112 with multi-layered circuits to narrow the width of the flexible circuit board 112 in comparison to flexible circuit board 108 described above, so the light-emitting diode light bar 114 can be entirely located in the space surrounded by the reflective cover 102 and the light guide plate 110. However, the thickness of the multi-layered flexible circuit board 112 is greatly increased, and the thermal conductivity of the insulation layer between the two adjacent layers in the flexible circuit board 112 is poor, so that the heat generated by the light-emitting diodes 106 of the light-emitting diode light bar 114 cannot be effectively conducted, thereby decreasing the efficiency, shifting the shades of color and reducing the life of the light-emitting diodes 106. In addition, the multi-layered flexible circuit board 112 is expensive, so that using the flexible circuit board 112 greatly increases the cost of the backlight module 100d.

SUMMARY

One or more embodiments of the present invention provides a backlight module, comprising: a light guide plate; a housing clipped to the light guide plate, wherein the housing and the light guide plate form a disposed space; and at least one light-emitting diode light bar disposed in the disposed space and providing the light guide plate with at least one light, wherein the light-emitting diode light bar comprises a flexible circuit board and a plurality of light-emitting diodes, and the flexible circuit board comprises a first portion and at least two second portions, wherein the light-emitting diodes are disposed on the first portion of the flexible circuit board, and the second portions are stacked with respect to each other.

One or more embodiments of the present invention also provides a liquid crystal display, comprising: a liquid crystal display panel; and a backlight module disposed on a rear side of the liquid crystal display panel, wherein the backlight module comprises: a light guide plate; a housing clipped to the light guide plate, wherein the housing and the light guide plate form a disposed space; and at least one light-emitting diode light bar disposed in the disposed space and providing the light guide plate with at least one light, wherein the light-emitting diode light bar comprises a flexible circuit board and a plurality of light-emitting diodes, and the flexible circuit board comprises a first portion and at least two second portions, wherein the light-emitting diodes are disposed on the first portion of the flexible circuit board, and the second portions are stacked with respect to each other.

One or more embodiments of the present invention further provides a fabrication method of a backlight module, comprising: providing a housing; providing at least one light-emitting diode light bar, wherein the light-emitting diode light bar comprises a flexible circuit board and a plurality of light-emitting diodes, and the flexible circuit board comprises a first portion and at least two second portions; folding up the second portions of the flexible circuit board; disposing the folded light-emitting diode light bar in the housing; and disposing a light guide plate to make the housing clip the light guide plate and form a disposed space with the light guide plate, wherein the light-emitting diode light bar is disposed in the disposed space and provides the light guide plate with at least one light.

One or more embodiments of the present invention further provides a fabrication method of a liquid crystal display, comprising: fabricating a backlight module, comprising: providing a housing; providing at least one light-emitting diode light bar, wherein the light-emitting diode light bar comprises a flexible circuit board and a plurality of light-emitting diodes, and the flexible circuit board comprises a first portion and at least two second portions; folding up the second portions of the flexible circuit board; disposing the folded light-emitting diode light bar in the housing; and disposing a light guide plate to make the housing clip the light guide plate and form a disposed space with the light guide plate, wherein the light-emitting diode light bar is disposed in the disposed space and provides the light guide plate with at least one light; and disposing a liquid crystal display panel on the backlight module.

BRIEF DESCRIPTION OF THE DRAWINGS

One or more embodiments are illustrated by way of example, and not by limitation, in the figures of the accompanying drawings, wherein elements having the same reference numeral designations represent like elements throughout and wherein.

DETAILED DESCRIPTION

Figure 1:
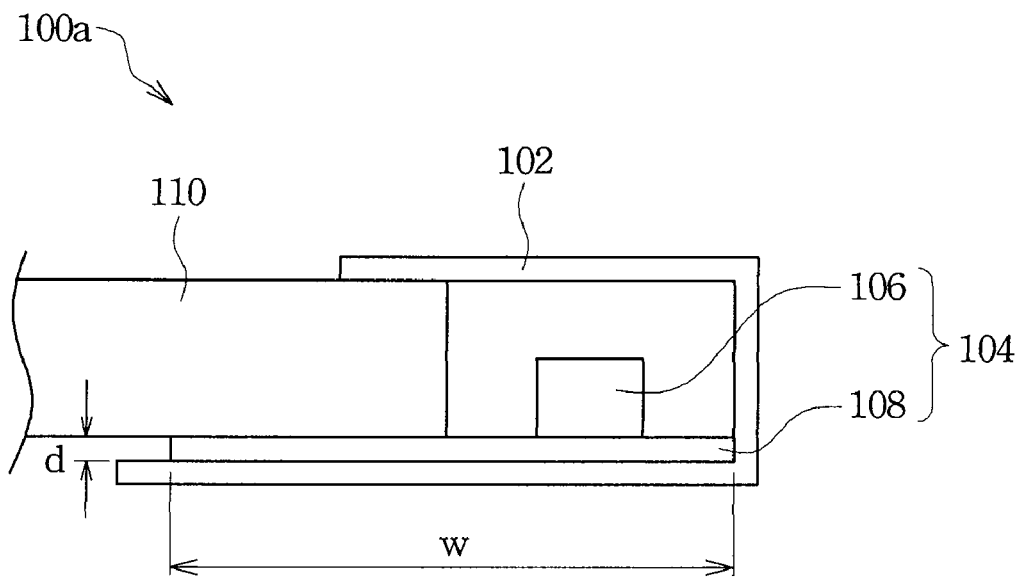
FIG. 1 illustrates a cross-sectional view of a portion of a conventional backlight module.
Figure 2:
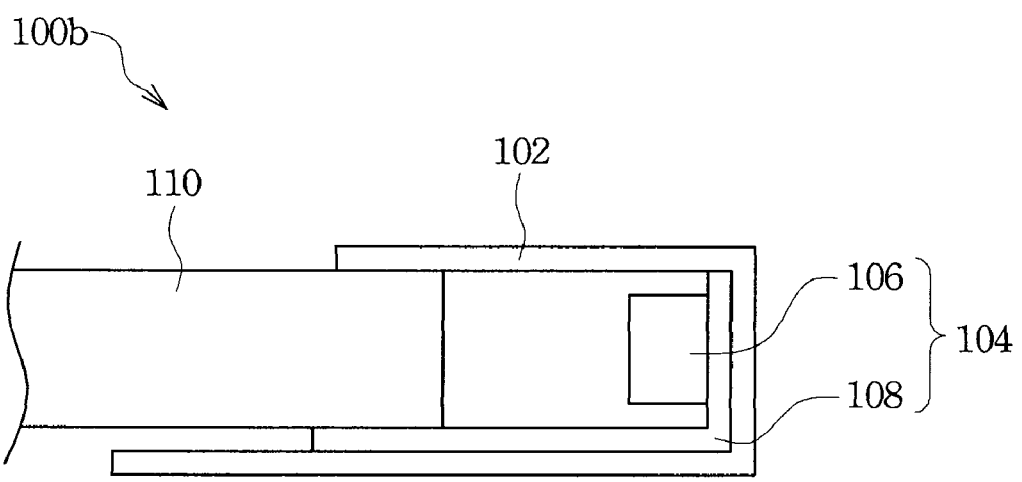
FIG. 2 illustrates a cross-sectional view of a portion of another conventional backlight module.
Figure 3:
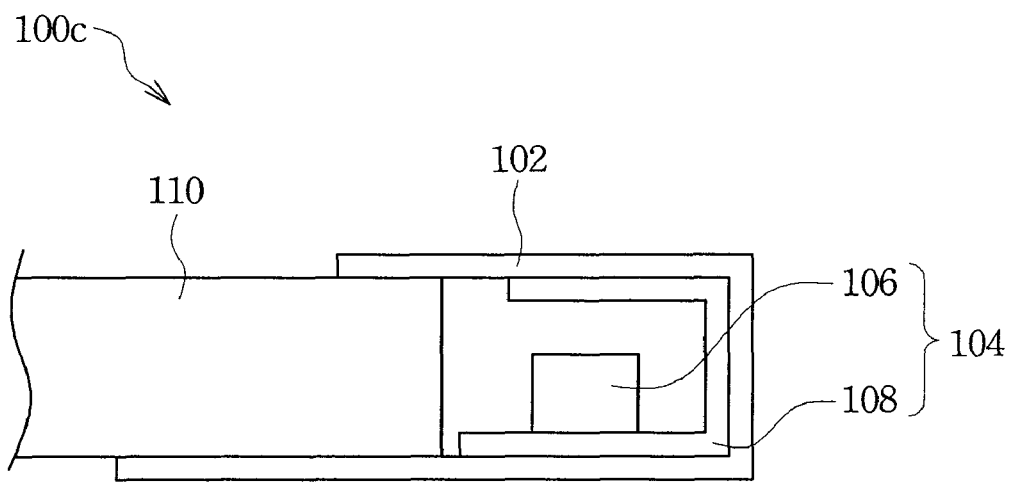
FIG. 3 illustrates a cross-sectional view of a portion of still another conventional backlight module.
Figure 4:
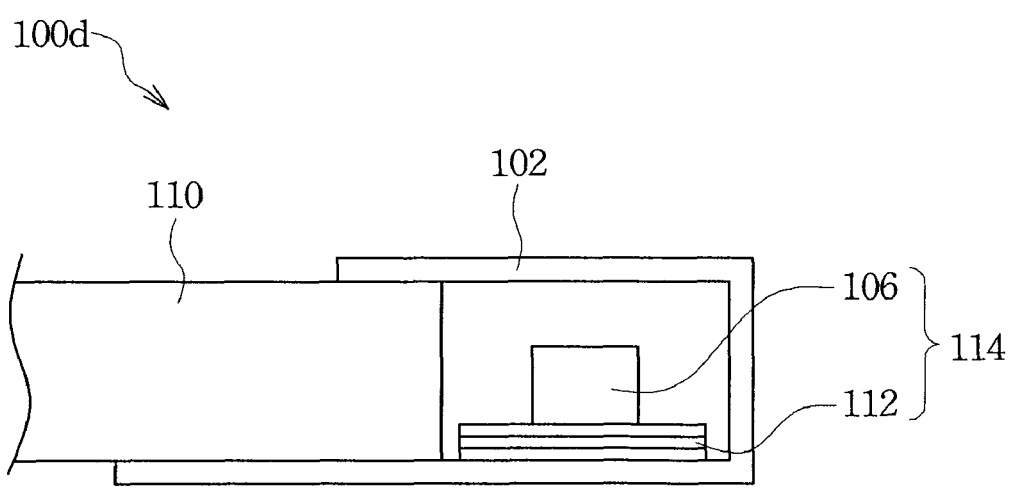
FIG. 4 illustrates a cross-sectional view of a portion of further another conventional backlight module.

In the following detailed description, for purposes of explanation, numerous specific details are set forth in order to provide a thorough understanding of the present invention. It will be apparent, however, that the present invention may be practiced without these specific details. In other instances, well-known structures and devices are schematically shown in order to simplify the drawing.

One or more embodiments of the present invention disclose a backlight module, an application and a fabrication method thereof. In order to make the illustration of the present invention more explicit, the following description is stated with reference to FIGS. 5 through 9.

Figure 5:
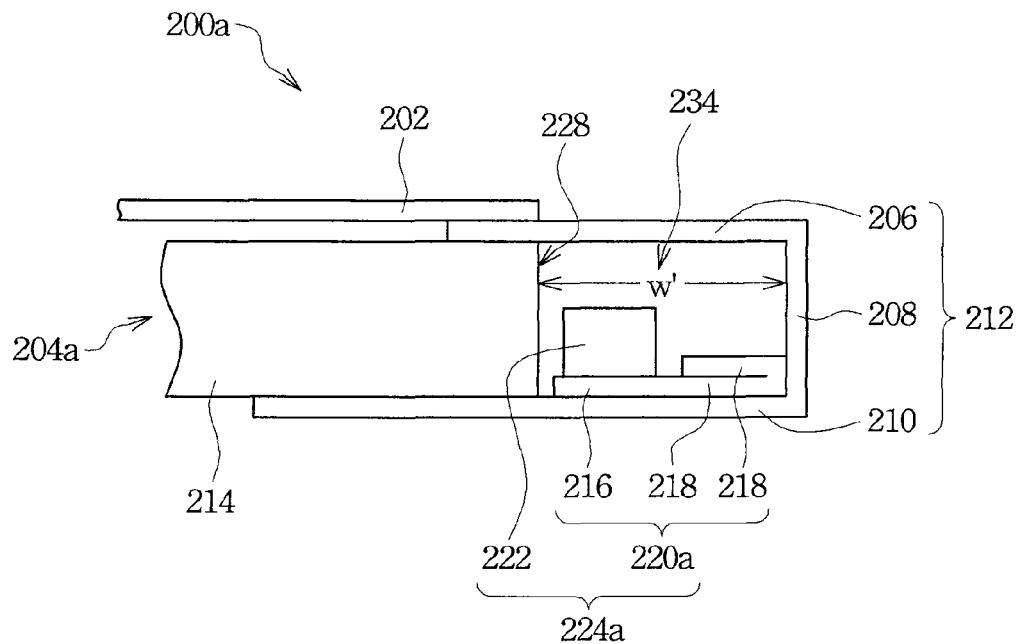
FIG. 5 illustrates a cross-sectional view of a liquid crystal display in accordance with a first embodiment of the present invention.

FIG. 5 illustrates a cross-sectional view of a liquid crystal display in accordance with a first embodiment of the present invention. In one embodiment, a liquid crystal display 200a is mainly composed a backlight module 204a and a liquid crystal display panel 202, wherein when the liquid crystal display 200a is fabricated, the liquid crystal display panel 202 is disposed on the fabricated backlight module 204a to make the backlight module 204a be disposed on a rear side of the liquid crystal display panel 202 to provide the liquid crystal display panel 202 with a back light source.

In the present exemplary embodiment, the backlight module 204a mainly comprises a housing 212, a light guide plate 214 and at least one light-emitting diode light bar 224a. In accordance with at least one embodiment, housing 212 is composed of a plastic material or a metal with high reflectivity, such as a white plastic material. The housing 212 comprises side plates 206, 208 and 210 connected in sequence, wherein a cross-sectional structure of the combination of the side plates 206, 208 and 210 is substantially a U-shaped structure, and the side plate 206 is positioned opposite to the side plate 210. In at least some embodiments, the light guide plate 214 is clipped between the opposite side plates 206 and 210 of the housing 212, and a side surface 228 of the light guide plate 214 is separated from the side plate 208 of the housing 212 by a distance w', so that a disposed space 234 is defined by the light guide plate 214 and the housing 212. A light-emitting diode light bar 224a is disposed in the disposed space 234 and is located between the side surface 228 of the light guide plate 214 and the side plate 208 of the housing 212, wherein the light-emitting diode light bar 224a can provide at least one light that enters the light guide plate 214 through the side surface 228. In at least some embodiments, the light-emitting diode light bar 224a is wholly or entirely disposed in the disposed space 234. The light-emitting diode light bar 224a is mainly composed of a flexible circuit board 220a and a plurality of light-emitting diodes 222, wherein the light-emitting diodes 222 are disposed on a surface of the flexible circuit board 220a.

In the light-emitting diode light bar 224a of the present exemplary embodiment, the flexible circuit board 220a comprises a first portion 216 and two second portions 218, wherein the light-emitting diodes 222 are disposed on the first portion 216, so that the first portion 216 of the flexible circuit board 220a is also referred to as a light source fixed region. The two second portions 218 of the flexible circuit board 220a are stacked with respect to each other to form a two-layered stack structure, thereby also being referred to as a stack region. Therefore, the flexible circuit board 220a comprises two regions, i.e. the light source fixed region formed by the first portion 216 and a stack region formed by the two second portions 218 stacked atop each other. In one embodiment, the second portions 218 of the flexible circuit board 220a may only be stacked together but not adhered to each other. In other embodiments, the second portions 218 may be adhered to each other by at least one adhesive layer (not shown). In at least some embodiments, first portion 216 and each second portion 218 of the flexible circuit board 220a substantially have the same thickness, and the stack region of the flexible circuit board 220a is formed by the two stacked second portions 218, so that the entire thickness of the stack region of the flexible circuit board 220a is larger than the entire thickness of the light source fixed region of the flexible circuit board 220a. In one embodiment, the flexible circuit board 220a may comprise more than two second portions 218, and the second portions 218 are stacked with respect to each other to form a structure composed of more than two layers.

When the liquid crystal display 200a is fabricated, the backlight module 204a and the liquid crystal display panel 202 may be firstly provided, and the liquid crystal display panel 202 is disposed on the backlight module 204a. Before the backlight module 204a is provided, the backlight module 204a is fabricated, wherein the housing 212 is firstly provided, at least one light-emitting diode light bar 224a is provided, and the flexible circuit board 220a of the light-emitting diode light bar 224a is bent at 180 degrees to stack the second portions 218. Then, the folded light-emitting diode light bar 224a is disposed in a space formed by the side plates 206, 208 and 210 of the housing 212, and the light guide plate 214 is disposed on the side plate 210 of the housing 212 and is clipped between the side plates 210 and 206 of the housing 212 to dispose the light-emitting diode light bar 224a in the disposed space 234 between the side surface 228 of the light guide plate 214 and the side plate 208 of the housing 212.

In the light-emitting diode light bar 224a of the present exemplary embodiment, the first portion 216 of the flexible circuit board 220a is located between the side surface 228 of the light guide plate 214 and the second portions 218 of the flexible circuit board 220a, so that the light source fixed region of the flexible circuit board 220a where the light-emitting diodes 222 are located is between the stack region and the side surface 228 of the light guide plate 214. In addition, the first portion 216 and the second portions 218 of the flexible circuit board 220a are all disposed on the side plate 210 of the housing 212, i.e. the light source fixed region and the stack region of the flexible circuit board 220a are all disposed on the side plate 210 of the housing 212.

Figure 6:
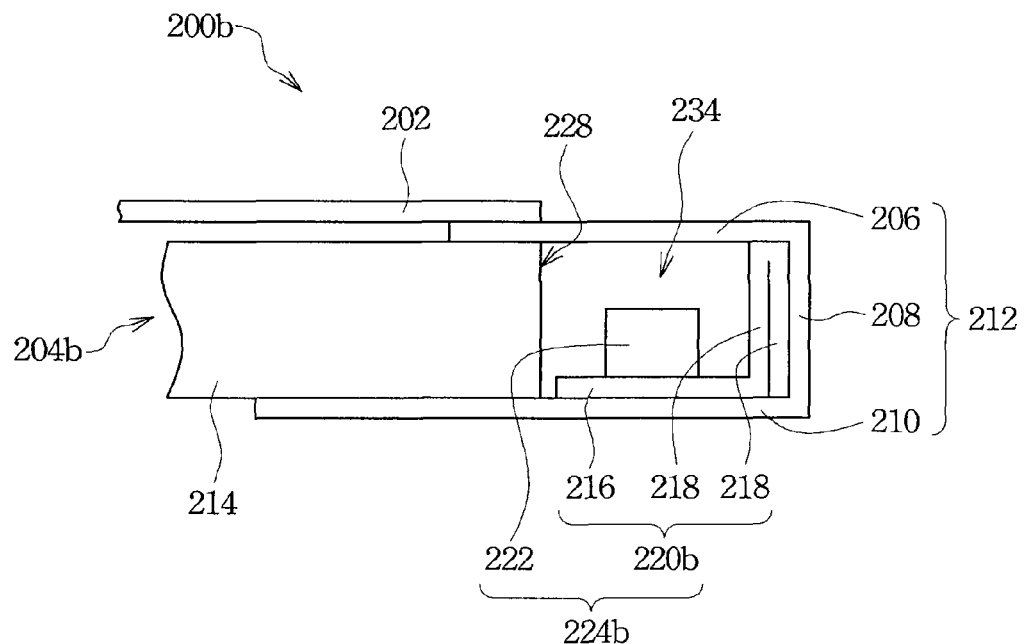
FIG. 6 illustrates a cross-sectional view of a liquid crystal display in accordance with a second embodiment of the present invention.

In one or more embodiments according to the present invention, the light-emitting diode light bar of the backlight module may include various arrangements. FIG. 6 illustrates a cross-sectional view of a liquid crystal display in accordance with a second embodiment of the present invention. In a backlight module 204b of a liquid crystal display 200b, a first portion 216 of a flexible circuit board 220b of a light-emitting diode light bar 224b is similarly disposed between a side surface 228 of a light guide plate 214 and second portions 218 of the flexible circuit board 220b. That is, a light source fixed region where light-emitting diodes 222 are located is between a stack region and the side surface 228 of the light guide plate 214. In the light-emitting diode light bar 224b, the first portion 216 of the flexible circuit board 220b is disposed on a side plate 210 of a housing 212, the second portions 218 are bent to form an included angle of about 90 degrees with the first portion 216, and the second portions 218 are disposed on an inner side surface of a side plate 208 of the housing 212, i.e., the light source fixed region of the flexible circuit board 220b is located on the side plate 210 and the stack region is located on the inner side surface of the side plate 208.

Figure 7:
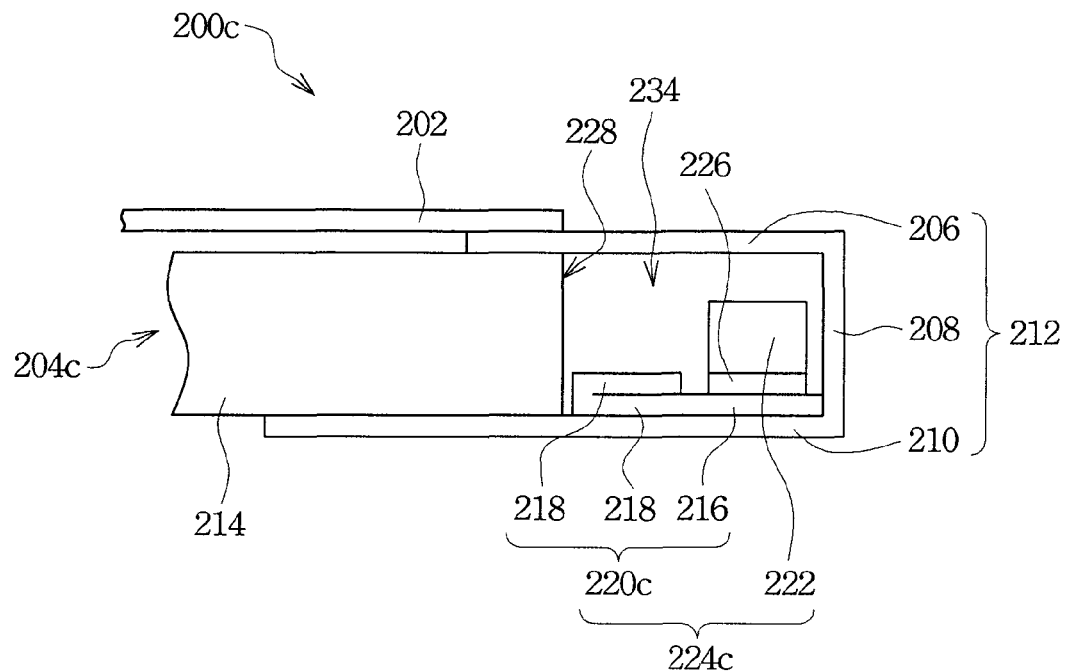
FIG. 7 illustrates a cross-sectional view of a liquid crystal display in accordance with a third embodiment of the present invention.

FIG. 7 illustrates a cross-sectional view of a liquid crystal display in accordance with a third embodiment of the present invention. In a backlight module 204c of a liquid crystal display 200c, second portions 218 of a flexible circuit board 220c of a light-emitting diode light bar 224c are disposed between a side surface 228 of a light guide plate 214 and a first portion 216 of the flexible circuit board 220c, i.e., a stack region of the flexible circuit board 220c is located between a light source fixed region where light-emitting diodes 222 are located and the side surface 228 of the light guide plate 214. In the light-emitting diode light bar 224c, the first portion 216 and the second portions 218 of the flexible circuit board 220c are disposed on the side plate 210 of the housing 212. In at least some embodiments, the first portion 216 and the second portions 218 are all disposed on the side plate 210, i.e., the light source fixed region and the stack region of the flexible circuit board 220c are both disposed on the side plate 210 of the housing 212. In one embodiment, the backlight module 204c may further selectively comprise a thermal conductive material layer 226. The thermal conductive material layer 226 is connected between the light-emitting diodes 222 and the flexible circuit board 224c to increase the heat dissipating efficiency of the light-emitting diodes 222. Another function of the thermal conductive material layer 226 is to elevate the light-emitting diodes 222 to prevent the light entering the side surface 228 of the light guide plate 224 from being masked due to the larger height of the second portions 218 of the flexible circuit board 220c.

Figure 8:
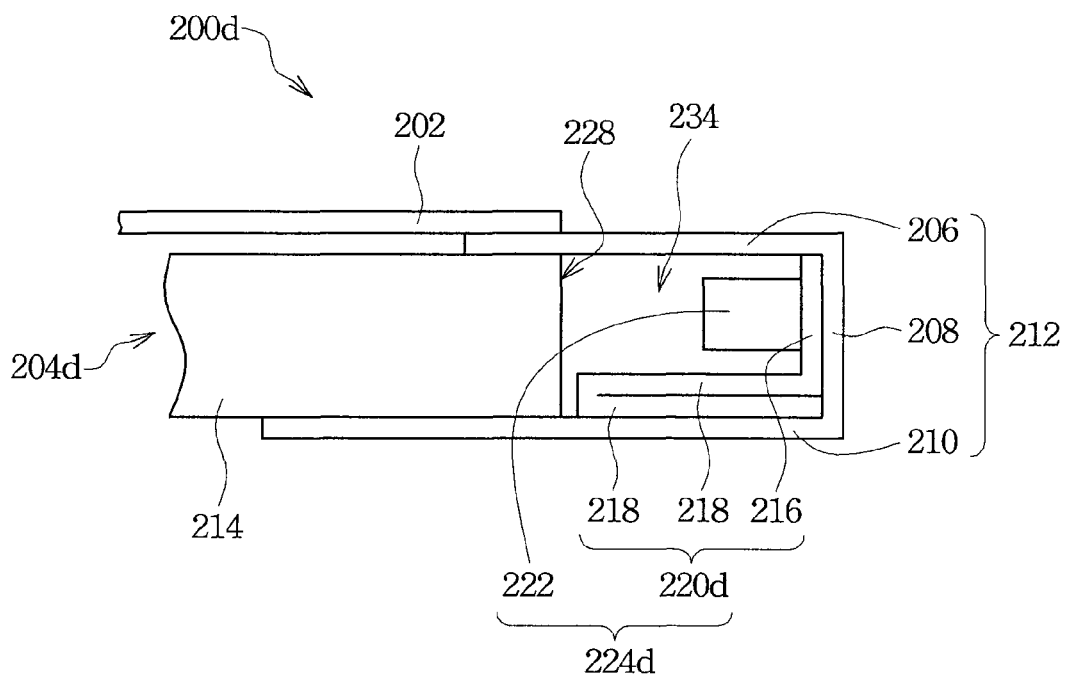
FIG. 8 illustrates a cross-sectional view of a liquid crystal display in accordance with a fourth embodiment of the present invention.

FIG. 8 illustrates a cross-sectional view of a liquid crystal display in accordance with a fourth embodiment of the present invention. In a backlight module 204d of a liquid crystal display 200d, a first portion 216 of a flexible circuit board 220d of a light-emitting diode light bar 224d is disposed on a side plate 208 of a housing 212, second portions 218 are bent to form an included angle of about 90 degrees with the first portion 216, and the second portions 218 are disposed on a side plate 210 of the housing 212, i.e., a light source fixed region of the flexible circuit board 220d is located on an inner side surface of the side plate 208 and a stack region is located on the side plate 210.

Figure 9:
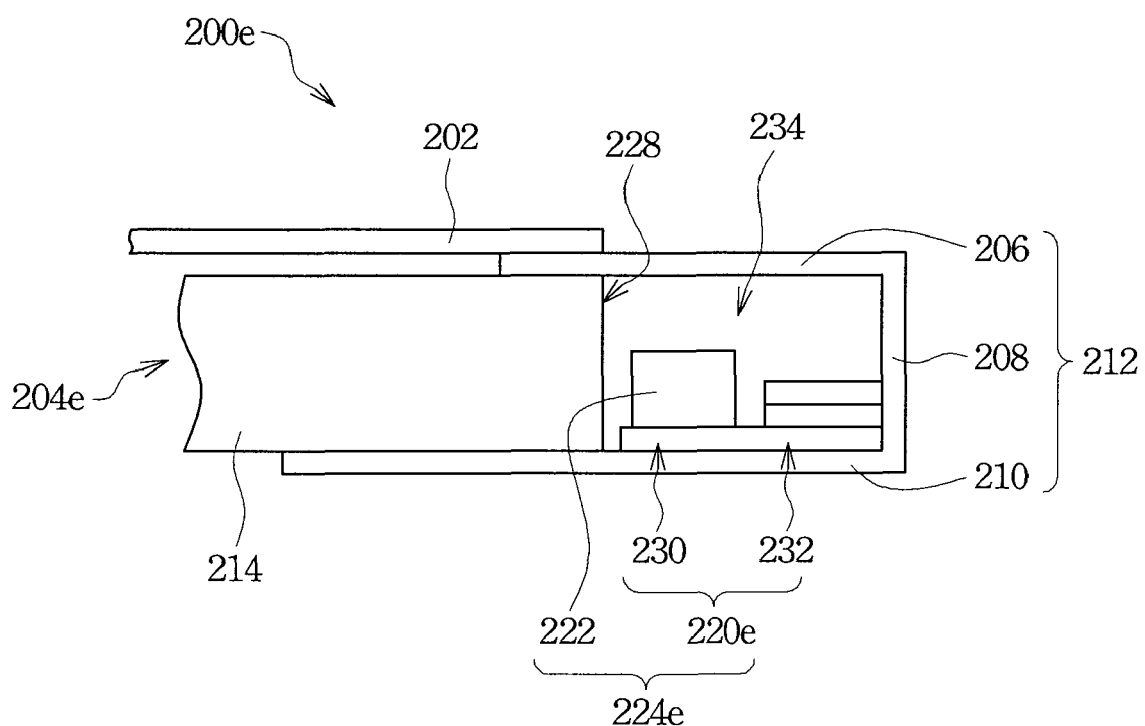
FIG. 9 illustrates a cross-sectional view of a liquid crystal display in accordance with a fifth embodiment of the present invention.

FIG. 9 illustrates a cross-sectional view of a liquid crystal display in accordance with a fifth embodiment of the present invention. In a backlight module 204e of a liquid crystal display 200e, a second portion 232 of a flexible circuit board 220e of a light-emitting diode light bar 224e includes a multi-layered circuit structure and a first portion 230 includes a single-layered circuit structure, and the thickness of the second portion 232 of the flexible circuit board 220e is larger than the thickness of the first portion 230. Any two adjacent layers in the multi-layered circuit structure of the second portion 232 of the flexible circuit board 220e may be adhered with each other with at least one adhesive layer (not shown). The first portion 230 of the flexible circuit board 220e is disposed between a side surface 228 of a light guide plate 214 and the second portion 232 of the flexible circuit board 220e. Light-emitting diodes 222 are disposed on the first portion 230 of the flexible circuit board 220e, so that the first portion 230 of the flexible circuit board 220e is also referred to as a light source fixed region. In the light-emitting diode light bar 224e, the first portion 230 and the second portion 232 of the flexible circuit board 220e are both disposed on a side plate 210 of a housing 212.

According to one or more of the aforementioned embodiments of the present invention, one advantage of at least some of the embodiments is that a non-light source fixed region of a flexible circuit board of a light-emitting diode light bar is folded up and the light-emitting diode light bar is packed in a housing to thereby increase the layout space of the flexible circuit board in a limited fabrication space and to lower the fabrication difficulty.

According to one or more of the aforementioned embodiments of the present invention, another advantage of at least some of the embodiments is that a sufficient wiring area is provided without affecting the heat dissipation of a light-emitting diode light bar, causing a light-masking problem or increasing the cost of a circuit board, so that the amount of light-emitting diodes is increased in comparison to prior approaches and to facilitate developing of a large liquid crystal display.

As is understood by a person skilled in the art, the foregoing embodiments of the present invention are illustrated examples of the present invention rather than limiting examples of embodiments of the present invention. Various modifications and similar arrangements are included within the spirit and scope of the appended claims, the scope of which should be accorded the broadest interpretation so as to encompass all such modifications and similar structure.

What is claimed is:

1. A backlight module, comprising:
   a light guide plate;
   a housing clipped to the light guide plate, wherein the housing and the light guide plate form a disposed space; and
   at least one light-emitting diode light bar disposed in the disposed space and providing the light guide plate with at least one light, wherein the light-emitting diode light bar comprises a flexible circuit board and a plurality of light-emitting diodes, and the flexible circuit board comprises a first portion and at least two second portions, wherein the light-emitting diodes are disposed on the first portion of the flexible circuit board, and the second portions are stacked with respect to each other.

2. The backlight module according to claim 1, wherein the first portion of the flexible circuit board is between the light guide plate and the second portions of the flexible circuit board.

3. The backlight module according to claim 2, wherein the housing further comprises a first side plate, a second side plate and a third side plate, and the light guide plate is positioned between the first side plate and the third side plate, wherein the first portion and the second portions of the flexible circuit board are disposed on the first side plate.

4. The backlight module according to claim 2, wherein the housing further comprises a first side plate, a second side plate and a third side plate, and the light guide plate is positioned between the first side plate and the third side plate, wherein the first portion of the flexible circuit board is disposed on the first side plate, and the second portions are disposed on the second side plate.

5. The backlight module according to claim 1, wherein the light-emitting diode light bar further comprises a thermal conductive material layer connected between the light-emitting diodes and the flexible circuit board.

6. The backlight module according to claim 1, wherein the second portions of the flexible circuit board are adhered to each other with at least one adhesive layer.

7. The backlight module according to claim 1, wherein the housing is composed of a reflective material.

8. A backlight module, comprising:
   a light guide plate;
   a housing clipped to the light guide plate, wherein the housing and the light guide plate form a disposed space; and
   at least one light-emitting diode light bar disposed in the disposed space and providing the light guide plate with at least one light, wherein the light-emitting diode light bar comprises a flexible circuit board and a plurality of light-emitting diodes, the flexible circuit board comprises a first region and a second region, and the light-emitting diodes are disposed on the first region, wherein a thickness of a structure of the flexible circuit board in the second region is greater than a thickness of a structure of the flexible circuit board in the first region.

9. The backlight module according to claim 8, wherein the first region is between the light guide plate and the second region.

10. The backlight module according to claim 9, wherein the housing further comprises a first side plate, a second side plate and a third side plate, the light guide plate is positioned between the first side plate and the third side plate, and the second region and the first region are disposed on the first side plate.

11. The backlight module according to claim 8, wherein the light-emitting diode light bar further comprises a thermal conductive material layer connected between the light-emitting diodes and the flexible circuit board.

12. The backlight module according to claim 8, wherein a structure of the flexible circuit board in the second region is composed of a portion of the flexible circuit board in a stack.

13. The backlight module according to claim 12, wherein the stack of the portion of the flexible circuit board in the second region includes at least two layers, and the layers are adhered to each other with at least one adhesive layer.

14. The backlight module according to claim 8, wherein the housing is composed of a reflective material.

15. A liquid crystal display, comprising:
    a liquid crystal display panel; and
    a backlight module disposed on a rear side of the liquid crystal display panel, wherein the backlight module comprises:
    a light guide plate;
    a housing clipped to the light guide plate, wherein the housing and the light guide plate form a disposed space; and
    at least one light-emitting diode light bar disposed in the disposed space and providing the light guide plate with at least one light, wherein the light-emitting diode light bar comprises a flexible circuit board and a plurality of light-emitting diodes, and the flexible circuit board comprises a first portion and at least two second portions, wherein the light-emitting diodes are disposed on the first portion of the flexible circuit board, and the second portions are stacked with respect to each other.

16. The liquid crystal display according to claim 15, wherein the first portion of the flexible circuit board is between the light guide plate and the second portions of the flexible circuit board.

17. The liquid crystal display according to claim 16, wherein the housing further comprises a first side plate, a second side plate and a third side plate, and the light guide plate is positioned between the first side plate and the third side plate, wherein the first portion and the second portions of the flexible circuit board are disposed on the first side plate.

18. The liquid crystal display according to claim 15, wherein the light-emitting diode light bar further comprises a thermal conductive material layer connected between the light-emitting diodes and the flexible circuit board.

19. The liquid crystal display according to claim 15, wherein the second portions of the flexible circuit board are adhered to each other with at least one adhesive layer.

20. The liquid crystal display according to claim 15, wherein the housing is composed of a reflective material.

* * * * *